US005789852A

United States Patent [19]

Cornelissen et al.

[11] Patent Number: 5,789,852
[45] Date of Patent: *Aug. 4, 1998

[54] RAPIDLY SCANNING CATHODE-RAY TUBE LASER

[75] Inventors: Hugo J. Cornelissen; Gerard E. Van Rosmalen; Cornelis J. Savert, all of Eindhoven; Gerardus A. H. M. Vrijssen, Weert, all of Netherlands

[73] Assignee: U.S. Philips Corporation, New York, N.Y.

[*] Notice: The term of this patent shall not extend beyond the expiration date of Pat. No. 5,521,464.

[21] Appl. No.: 582,813

[22] Filed: Jan. 4, 1996

Related U.S. Application Data

[63] Continuation-in-part of Ser. No. 359,325, Dec. 16, 1994, Pat. No. 5,521,464.

[30] Foreign Application Priority Data

Nov. 8, 1995 [EP] European Pat. Off. .............. 95203034

[51] Int. Cl.$^6$ .............................. H01J 29/46; H01J 29/50
[52] U.S. Cl. .................................. 313/450; 313/414
[58] Field of Search ...................... 313/414, 440, 313/450–53, 376–78, 382–83, 477 R, 477 HC, 420, 432, 439, 444, 452; 315/382, 461; 445/34; 65/110

[56] References Cited

U.S. PATENT DOCUMENTS 4,853,589  8/1989  Vrijssen ........................... 313/477
5,521,464  5/1996  Vrijssen et al. .................. 313/450

FOREIGN PATENT DOCUMENTS

0378268A1  7/1990  European Pat. Off. ......... H01J 29/62

OTHER PUBLICATIONS

"Electron Beam Pumped II–VI Lasers" by S. Colak et al. Journal of Crystal Growth 72 (1985) pp. 504–511.

Primary Examiner—Sandra L. O'Shea
Assistant Examiner—Mark Haynes
Attorney, Agent, or Firm—Robert J. Kraus

[57] ABSTRACT

An electron-beam-pumped laser includes a cathode ray tube containing a laser crystal, an electron gun for producing an electron beam including a multi-element focusing electrode layer on an inner surface of the tube for effecting focusing of the beam on the laser crystal, and a multi-element deflection electrode layer on an inner surface of the tube for effecting scanning of the beam across the laser crystal. The laser crystal is disposed on a metal heat-conductive support which is adapted for accurately positioning the laser crystal in closely spaced relationship with respect to the electron gun and to a laser light emitting window of the tube.

6 Claims, 8 Drawing Sheets

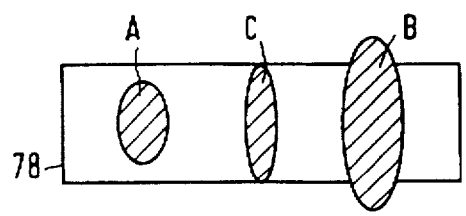
FIG.9
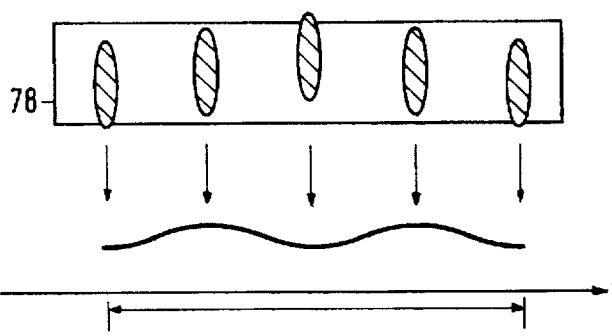
FIG.10a
FIG.10b
FIG.10c
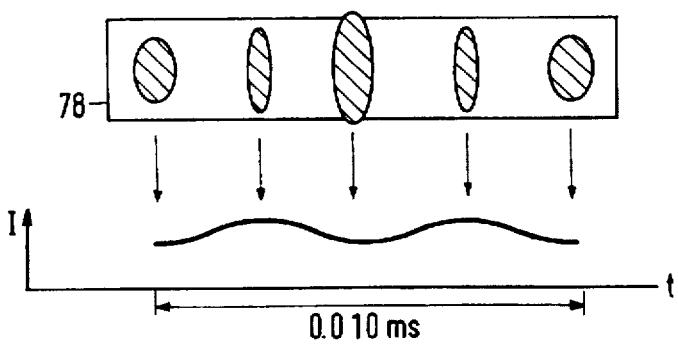
FIG.11a
FIG.11b
FIG.11c

RAPIDLY SCANNING CATHODE-RAY TUBE LASER

CROSS-REFERENCES TO RELATED APPLICATION

This application is a continuation-in-part of U.S. Pat. application No. 359,325 filed on 16 Dec. 1994, now U.S. Pat. No. 5,521,464.

BACKGROUND OF THE INVENTION

1. Field of the Invention

The invention relates to an electron-optical device comprising a cathode ray tube scanning laser having a target for electrons with an electron gun arranged opposite the target for producing an electron beam, said gun including a focusing lens for focusing the electron beam on the target, and means for causing the electron beam to scan the target.

2. Description of the Related Art

A promising alternative for mechanical laser scanners is the electron beam-pumped or the electron beam-addressed laser scanner (in the following also referred to as EBPLs). In these devices, an electron beam is focused on a multilayered bar of semiconductor material and scanned across its surface. The energy of the incoming electron beam is converted to photons in the semiconductor material. At and above certain power density levels, stimulated emission can be generated. In this way, a laser can be operated and it can be scanned with the speed of the electron beam. In the application of optical tape recording the modulation frequency of the laser should be around 50 MHz, and the transverse size of the elongated scanning laser spot must be 5–10 µm. For the electron beam spot this implies an elongated cross section of $(5-10) \times 250$ ($\mu m^2$).

In EP-A 378 268 (=U.S. Ser. No. 08/359,325) in the name of applicant the principle of operation of the EBPLs is disclosed. It is described how an electron beam is focused on a semiconductor laser crystal. The electron beam has an elongated cross section to achieve efficient laser operation in the semiconductor material. Scanning of the electron beam is done with a frequency of 50–100 kHz. A compact realization of an EBPL-tube, as described in the above reference and as sketched in FIG. 1, includes two main sections:

1. the electron gun section, realized with a "microneck glass gun";
2. a target section called the cup, which includes a light output window for passing the light emitted by the target crystal to the outside of the tube.

The construction of the cup should be such, that the electron beam spot size is very small, which means that the opening angle of the focused electron beam should be very large.

Other requirements are that the scanning movement of the electron beam across the laser crystal is stable and reliable.

Further, the light output should be high.

SUMMARY OF THE INVENTION

It is, inter alia, an object of the invention to provide an efficient electron-optical device comprising a cathode-ray tube enabling a small spot to scan a crystal target at a high frequency and enabling a high light output to be achieved.

To this end an electron-optical device comprising a cathode-ray tube of the type described in the opening paragraph is characterized in that the target comprises at least one laser crystal, an electrostatic focusing lens is formed in at least a portion of a multi-element layer electrode arranged on an inner surface of the tube, the envelope comprises a side window, and the laser crystal is arranged on a metal support which is provided with positioning means to arrange the crystal in aligned and accurately, closely spaced relationship with respect to the side window and the electron gun.

The arrangement of the laser crystal on a metal support which is provided with positioning means for arranging the crystal in aligned and accurately, closely spaced relationship with respect to the electron gun enables the crystal to be reproducibly positioned at a very small distance from the end of the electron gun. This small distance is necessary to achieve a large opening angle of the focused electron beam, which is directly connected to the electron-optical spot size.

Further the arrangement of the laser crystal on a metal support provided with positioning means for arranging the crystal in aligned and accurately, closely spaced relationship with respect to the side window enables the crystal to be reproducibly positioned at a very small distance from the side (output) window. This small distance guarantees a high light output.

The use of an electrostatic focusing lens formed in a multi-element layer electrode on an inner surface of the tube enables the use of a small diameter tube, which enables high efficiency deflection, especially if the target is scanned at high frequencies, especially in the 50–100 kHz range and higher.

It is a further object of the invention to provide an electro-optical device comprising a cathode-ray tube enabling a small spot to scan a crystal target in a stable and reliable fashion.

According to a first embodiment an electron-optical device comprising a cathode ray tube of the type described in the opening paragraph is characterized in that the device includes means for obtaining a feedback voltage having the proper information for promoting optimum centring of the electron beam during the scanning operation.

Hereby a scanning movement centred across the laser crystal is maintained. Possible slow drift away from the optimum setting is prevented.

According to a second embodiment an electron-optical device comprising a cathode ray tube of the type described in the opening paragraph is characterized in that the device includes means for obtaining a feedback voltage having the proper information for promoting an optimum focus setting.

Hereby a focus on the laser bar is maintained during a scan. Possible slow changes of the focus voltage over time because of stray magnetic fields, temperature effects or aging of the cathode or of the laser crystal are prevented.

According to a third embodiment an electron-optical device comprising a cathode ray tube of the type described in the opening paragraph is characterized in that the device includes means for obtaining a feedback voltage having the proper information for promoting optimum transverse beam elongation. Hereby an optimum elongated shape of the beam spot is maintained. Possible slow drift is prevented.

BRIEF DESCRIPTION OF THE DRAWINGS

These and other aspects of the invention will be described in greater detail with reference to the following embodiments and the drawings in which:

FIGS. 9, 10 and 11 show the scanning of a laser crystal with variously shaped and/or positioned electron beams.

DESCRIPTION OF THE PREFERRED EMBODIMENTS

Figure 1:
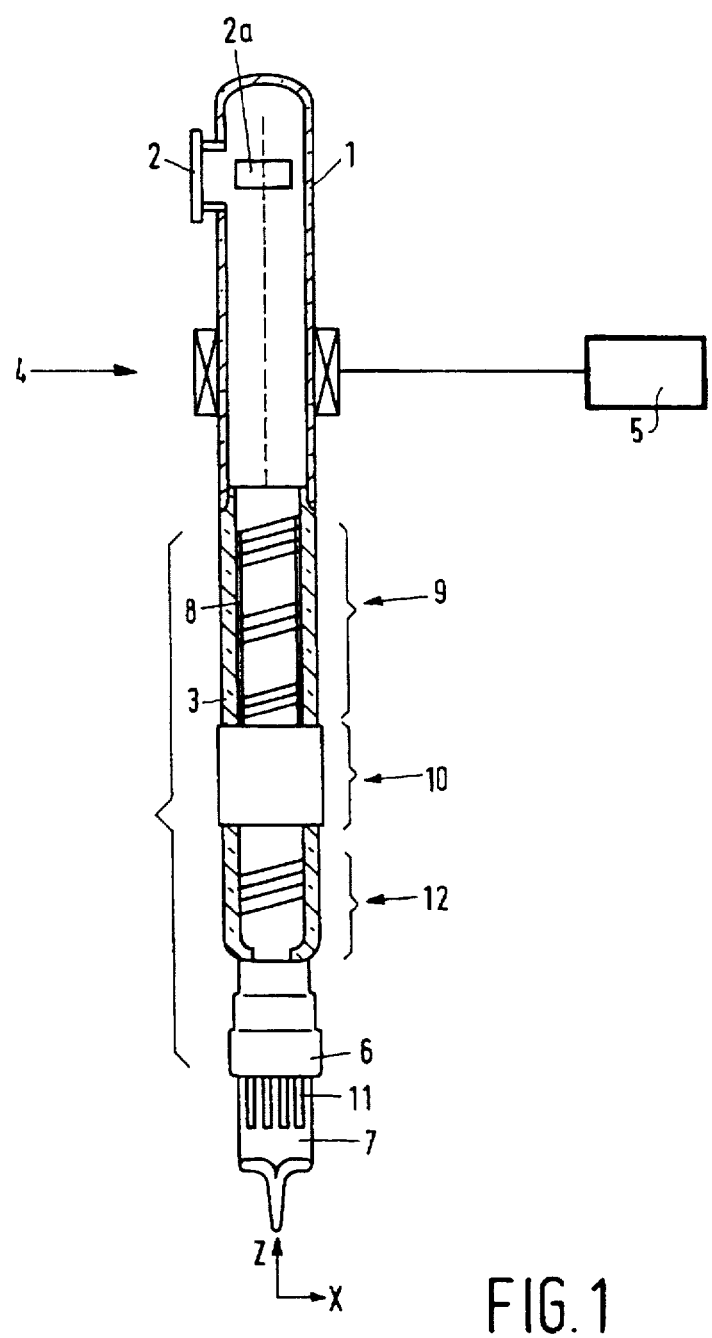
FIG. 1 shows diagrammatically a partial cross-section of a cathode-ray tube.

FIG. 1 shows a cathode-ray tube having an envelope with an end, or cup, portion 1, a side window 2, and a target in the form of a laser crystal 2a arranged opposite to the window 2. The end portion 1 is secured to a cylindrical neck portion 3, for example, by means of a pyro-ceramic connection (enabling a portion to be secured at relatively low temperatures). The neck portion 3 has a wall thickness which may be between 1 and 3 mm and an outer diameter which may be between 7 and 15 mm. The lower limit of 7 mm is closely related to the dimensions of the conventional thermionic cathodes. When, for example, a p-n emitter is used, the diameter of the tube (neck) may be even smaller than 7 mm, for example 6 mm externally and 5 mm internally. Also at these small dimensions the "helical lens" to be described hereinafter is found to yield a satisfactory result. In the FIG. 1 embodiment the neck portion 3 is surrounded by a deflection system in the form of a deflection unit 4 having a correspondingly small inner diameter. The cathode-ray tube according to the invention could be referred to as "microneck" tube). The deflection unit 4 is connected to a deflection generator 5. For deflection in two orthogonal directions the deflection unit 4 may comprise two coil systems. In an alternative embodiment the deflection unit 4 may have one coil system for deflection into a first direction, and electrodes for deflection into a second direction, for example, the direction at the low scanning frequency, may be arranged within the tube. It is even possible for the tube to have deflection electrodes which are arranged only on the inner surface of the neck. The free end 6 of the neck portion 3, in which beam-shaping electrodes are arranged, terminates in a cylindrical portion 7 having a reduced outer diameter. A high-ohmic resistance layer 8 from which a helical structure is formed which constitutes a focusing lens 9 and possibly a prefocusing lens 12 is arranged on the inner wall of neck 3. Strip-shaped leadthroughs 11 ensure that a static focusing signal is applied to the helical structure of the focusing lens 9. Dynamic focus correction signals can be externally applied in a simple manner by means of a capacitive coupling element 10 arranged on the outer wall of neck portion 3.

Figure 2:
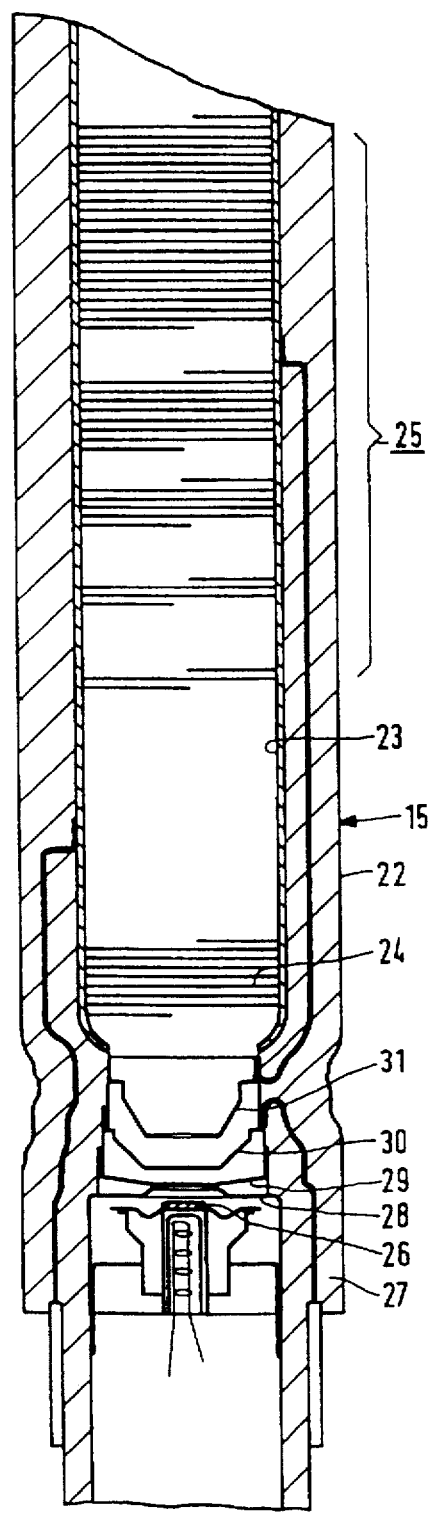
FIG. 2 shows diagrammatically a cross-section of a more detailed part of a cathode-ray tube.

FIG. 2 shows in greater detail the neck portion of a cathode ray tube with a cathode having an emissive surface 26. Beam-shaping electrodes denoted by the reference numerals 28, 29, 30 and 31 are arranged on a stepped inner surface of the neck portion 27, while the reference numeral 23 denotes the high-ohmic resistance layer and the reference numerals 24 and 25 denote helical focusing lens portions.

Adjacent to the beam-shaping portion with the electrodes 28, 29, 30 and 31, the electron gun may have a prefocusing portion formed as a helix 24 in the high-ohmic resistance layer 23.

The manufacture of the electron gun may easily start from a glass tube 15 (in which the high-ohmic resistance layer 23 and the electrodes 28, 29, 30 and 31 are to be arranged), which tube is softened by heating it and is drawn on a mandril.

Operation of the device at scanning frequencies substantially higher than 16 kHz implies that the energy dissipation in the deflection system as well as the flyback voltage increase considerably if no measures are taken.

A cathode-ray tube design which is characterized by a reduced neck diameter and a correspondingly small deflection system (which is thus located close to the electron beam) can solve this problem to a considerable extent, because the volume which is filled with magnetic energy is maintained as small as possible. In a conventional system of a cathode ray tube and deflection coils with a neck diameter of 22.5 mm, it is necessary to use, for example, 81.2 Ampere turns to drive the deflection system. In a display tube-deflection coil system according to the invention, with a neck diameter which is approximately half this value, only 32.5 Ampere turns are necessary. The energy dissipation is found to be lower by a factor of approximately 2.5. The use of multiple wire (stranded wire) for the deflection coils may contribute to an even further reduced heat dissipation. Despite the small neck diameter, a good spot quality is maintained by using a special focusing lens. This focusing lens is of a multi-element layer electrode type. An embodiment of this electrode is a high-ohmic resistance layer having a helical structure which is arranged on the inner surface of the neck. In the embodiment shown in FIG. 2 the high-ohmic resistance layer 23 of the focusing lens is arranged on the inner surface of one end of the glass tube 15 and the sheet-material electrodes 28, 29, 30 and 31 of the beam-shaping part are arranged against the inner surface of the other end of the glass tube 15 at locations having a stepped diameter.

These stepped-diameter locations are obtained with great reproducibility and accuracy by drawing a tube section on a mandril which changes diameter in the longitudinal direction several times. A glass tube 15 as shown in FIG. 2 is obtained, for example, by drawing on a mandril which has two parts, which parts are removed from the glass tube in the opposite direction after drawing.

The electrodes 28, 29, 30 and 31 can be mounted very accurately because abutment faces for the electrodes are formed in the glass tube during the drawing operation.

Short, drawn thin-walled bushes with bottoms having central apertures for passing the electron beam are preferably used as electrodes.

Such bushes can be made easily and accurately so that the mutual distance between the bottoms and the concentricity of the apertures is also accurately determined (approximately 5 µm) after mounting. Moreover, such bushes can easily be adapted to the tube surface in the case of heat treatments at lower temperatures.

Helical focusing lenses 24 and 25 having a good quality and a high breakdown voltage are obtained by providing a layer comprising a stable, viscous binder-free suspension of ruthenium oxide particles and glass particles (glass enamel powder) in isopropanol on the inner wall of the glass tube 15. After sedimentation and drying a 5–10 µm thick powder layer adhering to the glass is the result. A high-ohmic glass layer 23 containing ruthenium oxide and having a thickness of several microns is formed therefrom by means of a heat treatment in which the glass powder melts. Prior to heating, helices 28 and 29 are provided in the layer.

The helix has a pitch of, for example, 350 µm and the interruption in the resistance layer is 50 µm. After a firing treatment these interruptions have a very good voltage stability (breakdown voltage 20 kV/mm).

The layer is heated at 500° C. for approximately 20 minutes and thereby acquires a resistance of $10^7$ Ohms per square. Dependent on the quantity of ruthenium oxide, the temperature and the duration of the heating step, the resistance per square may be between $10^4$ and $10^8$ Ohm. The total resistance of the helix obtained may be, for example 10 GOhm, which means that a current of approximately 3 μA win flow through the helix when a voltage of 30 kV is applied. The high-ohmic, electrically conducting glass layer of the helix obtained can withstand further tube-processing steps up to 400° C.

The high-ohmic resistance layer 23 and the electrodes 28, 29, 30 and 31 can be contacted in different manners. Electrical connections may be made, for example by providing narrow, axially extending metal strips in the tube wall. One end of the strips then projects (radially) through an aperture in the inner wall so as to make contact in situ with the electrodes. The other end projects (axially) outwards at the flat end of the tube structure. This is described in U.S. Pat. No. 4,853,589 in the name of Applicant which is herein incorporated by reference.

In the part of the resistance layer which is not used for the focusing lens a four-pole element may be formed so as to give the electron beam an elongate shape by way of an electrostatic process. For certain uses it may be advantageous to scan with an elongate spot. An alternative is to give the apertures in one or more electrodes of the beam-shaping part a suitable (non-round) shape for this purpose or to provide the gun with a magnetic four-pole element. Combined or not combined with a four-pole element structure, a multi-pole element structure may be formed in said part of the resistance layer so as to provide a deflection facility.

Instead of a ruthenium comprising composition, the high-ohmic resistance layer may comprise, for example, manganese oxide, nickel oxide, thallium oxide and the like.

The electron source used in the gun may be a conventional thermionic source such as an indirectly heated oxide cathode or a dispenser cathode.

The use of a pn emitter as an electron source may yield considerable advantages within the scope of the invention. For example, a pn emitter having a surface of 1 μm$^2$ may supply a current of 10 μA (=1000 A/cm$^2$). This means that, for example, a current of 3 μA can be produced by a "rectangular" pn emitter of 1 μm wide and 300 μm long, or by a "round" pn emitter having a radius of 50 μm. Due to such a favourable current distribution, the equivalent current density of such an electron source corresponds to that in a conventional thermionic cathode which would work at a current density which is more than twice as high.

A number of specific constructions in relation to their advantages when used in an electron-optical device comprising a cathode-ray tube with a target comprising a laser crystal will be described in the following. This device is referred to as an electron beam pumped "scannable" laser or scanning laser crt. In this case a compact construction, high scanning frequency, the possibility of electrostatic spot shaping, (for example an electrostatic four-pole for providing an elongate spot) electrostatic focusing and, if desired, electrostatic deflection in one direction or in two orthogonal directions may be of great importance.

Figure 3A:
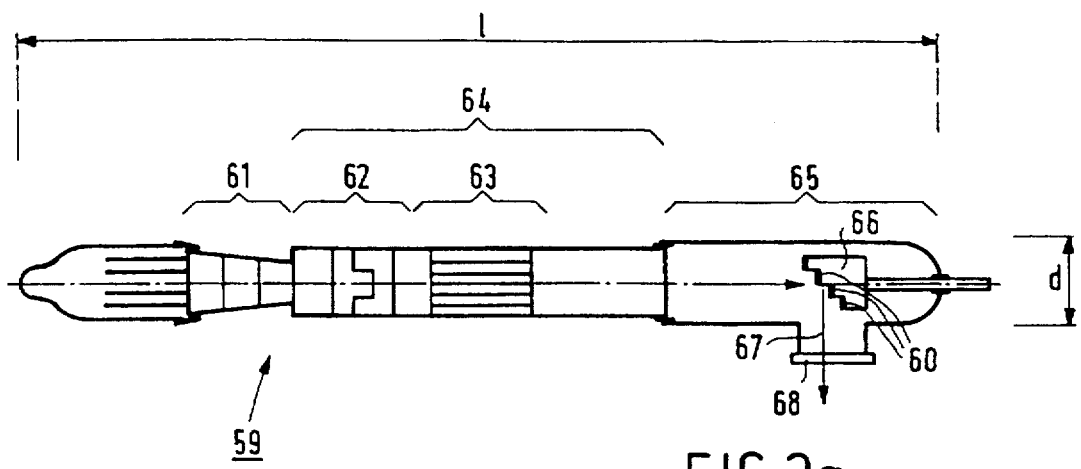
FIG. 3a and FIG. 3b are longitudinal sections of an electron beam pumped laser.

FIG. 3a is a diagrammatic longitudinal section of such an electron beam pumped laser.

Five portions can be distinguished:

A beam-producing portion 61. This portion comprises a cathode for generating electrons and a (triode) part for drawing the generated electrons into the tube 59.

A portion 62 in which an electrostatic four-pole is produced to give the electron beam an elongate cross-section, which is favourable for efficiently pumping transversally pumped lasers. (This is generally unnecessary for longitudinally pumped lasers).

A deflection portion 63. An electrostatic deflection field for scanning the target in one direction or in two orthogonal directions can be obtained by means of an electrostatic multipole to which deflection signals are applied. The deflection signals are applied by DC or capacitive connection. This section may alternatively comprise means for giving the electron beam an elongate cross-section. The four-pole in portion 62 can then be dispensed with.

A (cylindrical) focusing portion 64 of the type described above (including a multi-element layer electrode of a high-ohmic material, for example, a helical structure of a high-ohmic material provided on the inner surface of (cylindrical) envelope part 59. For a compact realisation the outer diameter may be $\leq 15$ mm, as in the configuration described hereinbefore).

Figure 3B:
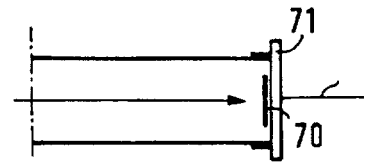

A target portion 65. This portion comprises in this case a stepped laser crystal holder 66. In the embodiment of FIG. 7, (but the invention is not limited to this embodiment) the holder 66 carries a laser crystal 60 on each of its steps, which crystals have been obtained, for example, by cleaving a larger crystal. These crystals may produce laser beams of the same wavelength. An interesting alternative is to use crystals producing laser beams at different wavelengths (for example, red/green/blue). The construction of FIG. 7 is suitable for the transversal mode in which a generated laser beam 67 leaves the tube 59 through a transparent side window 68. In a construction which is suitable for the longitudinal mode a laser beam 69 generated by e-beam pumping of a laser crystal 70 leaves the tube through a transparent front window 71 (of, for example, sapphire). See FIG. 3b.

Figure 4:
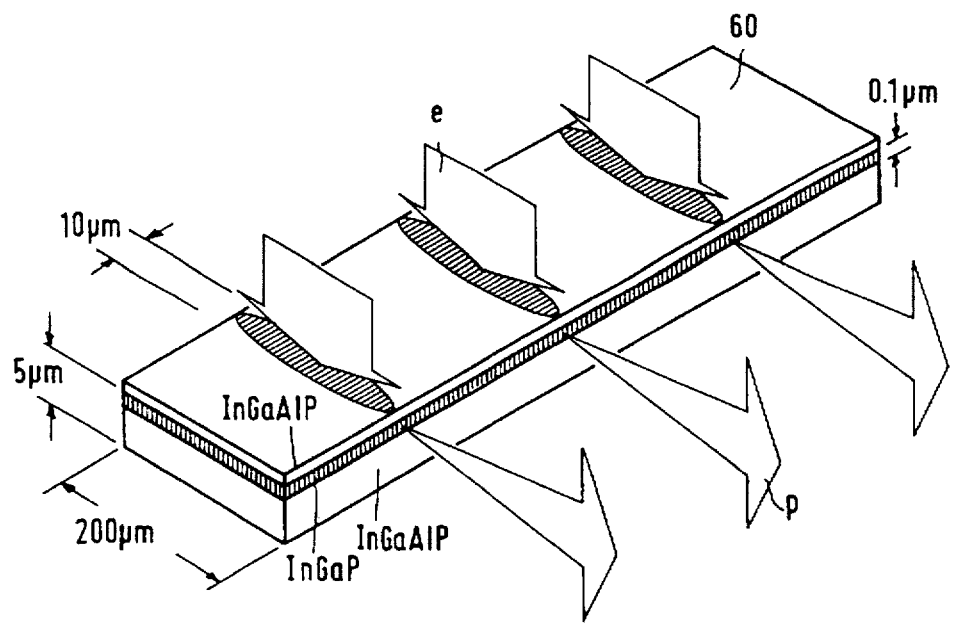
FIG. 4 shows the scanning of a laser crystal.

FIG. 4 shows one rod-shaped laser crystal 60, for example, an epitaxially grown double heterostructure of InGaP/InGaAlP with a height of 10 mm and a width of 200 μm. By scanning with an electron beam e having a narrow, elongate cross-section it is possible to excite, for example, 1000 pixels consecutively so that 1000 laser beams p are produced consecutively. The electron beam e can be moved very rapidly across the surface of the crystal 60, for example, at a bit rate in the MHz range. Bit rates above 20 Mbit/sec, for example even 100 Mbit/sec are feasible. The target may comprise a plurality of such laser crystals which are simultaneously scanned by the electron beam.

Suitable laser crystals are, inter alia, III-V double heterostructures or II-VI semiconductor laser structures. For the principle see: S. Colak, B. J. Fitzpatrick, R. N. Bhargava, J. Crystal Growth 72 (1985), page 504.

Applications which particularly benefit from the higher scanning frequencies made possible by the invention are, inter alia:
optical writing and reading (particularly on tape),
quasi-parallel reading/writing on optical discs,
laser display with improved resolution.

If an elongate spot of the electron beam is required on the target, the focusing lens (for example, the focusing lens 9 of the cathode-ray tube shown in FIG. 1) is provided with a non-rotationally symmetrical lens element (four-pole element).

Figure 5:
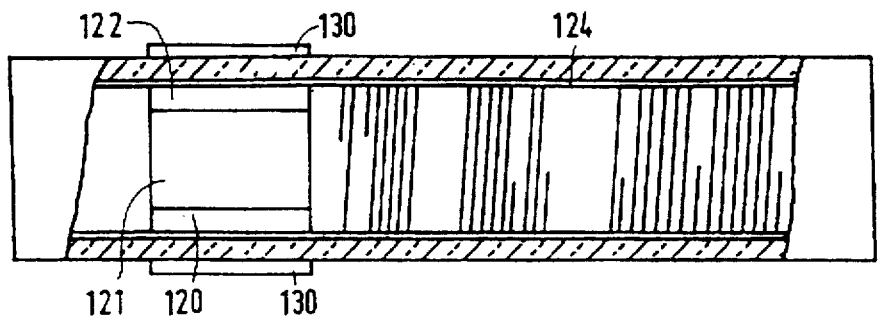
FIGS. 5, 6a and 6b, 7a and 7b show cross-sections through cathode-ray tube necks accommodating different embodiments of a structure generating a four-pole field.

FIG. 5 shows diagrammatically a cross-section of a neck of a cathode-ray tube with a layer 124 of a high-ohmic material provided on the inner surface and incorporating a helical structure which constitutes a focusing electrode (focusing lens). A part of the layer 124 without the helical structure is divided into four axial segments 120, 121, 122, 123 each covering 90 degrees of the circumference and being connected to the focusing electrode via a high resistance. If a focusing signal is applied to a connection point of the layer, the segment system 121, 122, 123, 124 produces an electrostatic four-pole field.

Figure 6A:
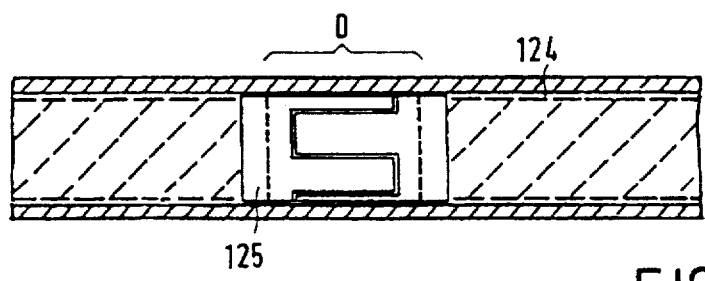

FIG. 6a shows an alternative construction for producing an electrostatic four-pole field in a tube neck. In this case the high-ohmic layer is interrupted over a given length D (of, for example 5 mm). A tubular metal electrode 125 consisting of two parts, whose ends overlap the high-ohmic layer 124, is arranged within the tube neck. The facing parts of the electrode 125 have a finger-shaped (or crenel-shaped) structure so that four fingers are located on the circumference in diametrically opposite positions.

Figure 6B:
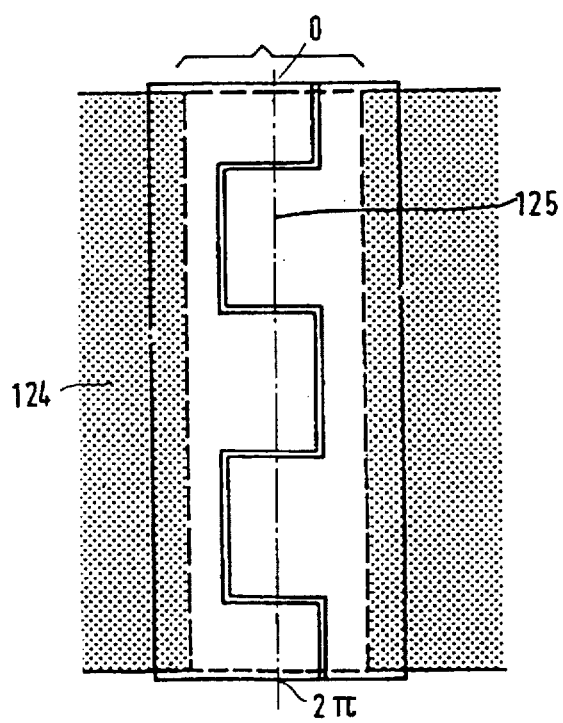

FIG. 6b shows a larger detail of a structure similar to the structure of FIG. 6a generating the four-pole field.

Figure 7A:
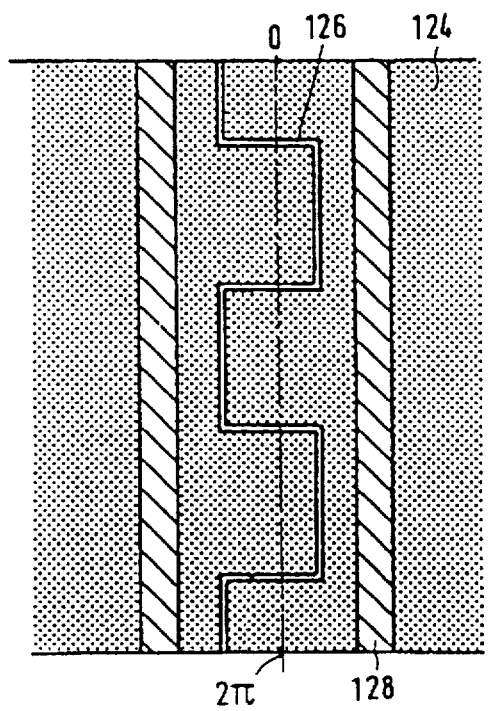

FIG. 7a shows a larger detail of an alternative structure generating a four-pole field. In this case the high-ohmic layer 124 is structured in such a way (for example, by providing a scratch 126) that the layer 124 itself has the desired finger structure.

Figure 7B:
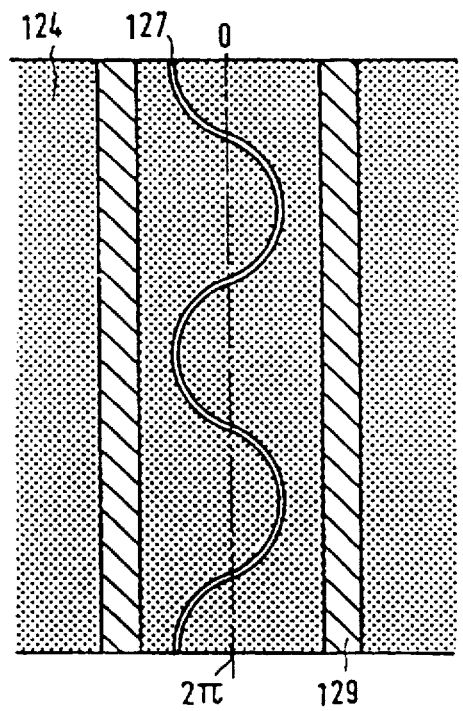

FIG. 7b shows a larger detail of a further structure generating a four-pole field. In this case the high-ohmic layer 124 is provided with a "wavy" scratch 127 instead of a crenel-shaped scratch with right angles so as to obtain the finger structure. Such a scratch can be provided more easily. The variation of the scratch 127 may satisfy, for example, a $\sin 2\Phi$ function.

In the latter cases the structure generating a four-pole field may be combined with low-ohmic electrodes such as (clamping) strips 128, 129 for DC supply of a dynamic focusing signal. In the case of FIG. 6a the dynamic focusing signal may be directly applied to one of the parts of the electrode 125. In the case of FIG. 5 a metal electrode 130 having a segmented structure corresponding to the structure in the high-ohmic layer 124 may be provided on the outer surface of the tube neck. These segments may be connected to a tubular part to which the dynamic focusing signal is applied. This signal is coupled capacitively into the high-ohmic layer 124.

Figure 8:
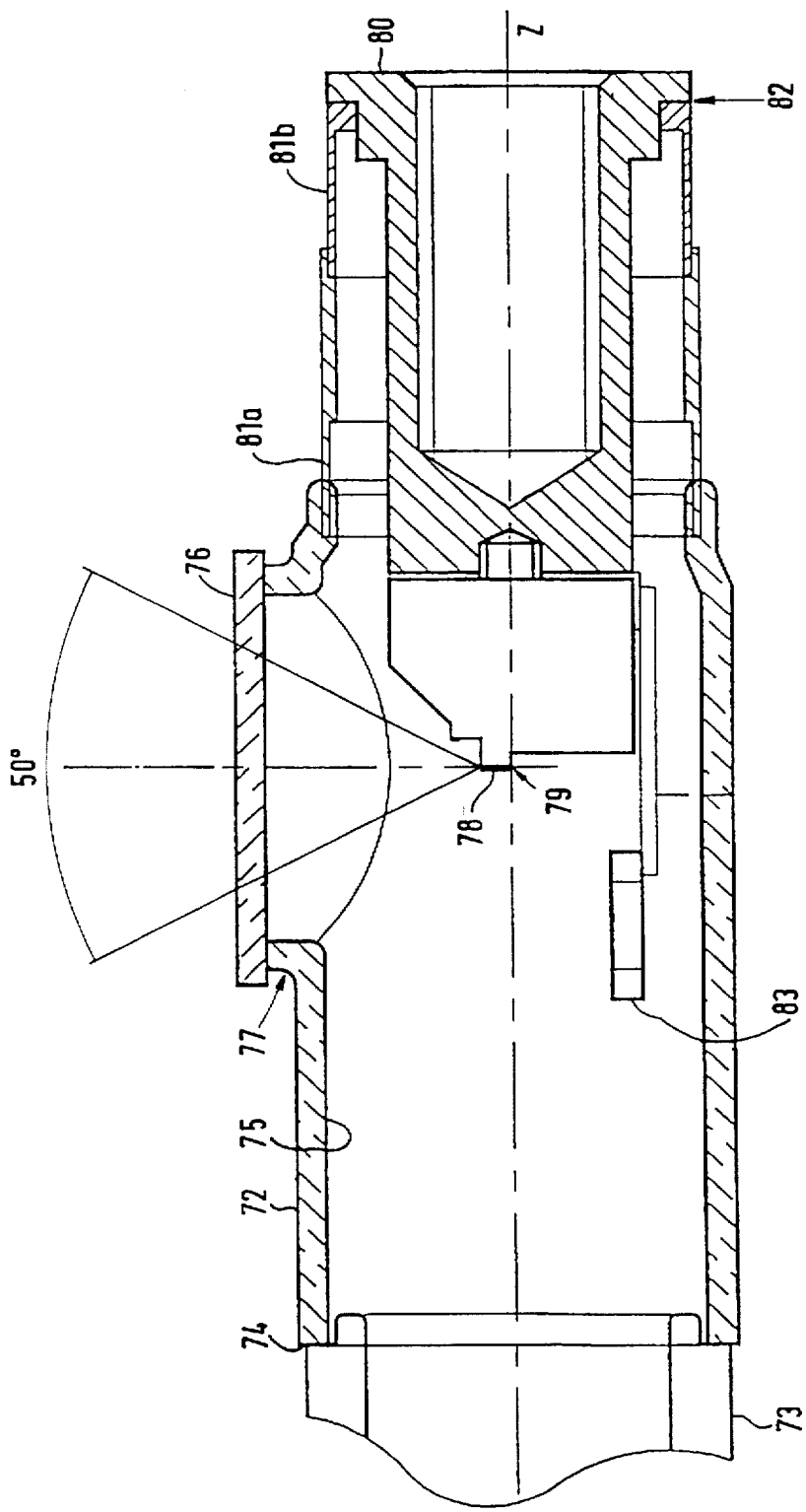
FIG. 8 is a longitudinal section of a part of an electron beam pumped laser.

The foregoing mainly dealt with the microneck glass gun section. In the following some constructional details of the target section (the cup portion) are given, with reference to FIG. 8.

The cup should meet a number of requirements/ specificatons:

The cup should contain a laser crystal at a position closely spaced (space e.g. in the range from 10 to 30 mm, especially about 20 mm) from the end of the electron gun. This small distance is necessary to achieve a large opening angle of the focused electron beam, which is directly connected to the electro-optical spot size.

It should be connected to the microneck glass gun with a vacuum tight seal.

It should contain an electrically conductive coating to establish a high voltage contact to the glass gun and to bleed off the back-scattered electrons.

The cup also should contain an optically flat output window. Additionally:

The laser crystal should be positioned at a short distance from the output window.

The laser crystal should be provided with an electrical contact for applying high voltage (eg. 5–20 kV).

The laser crystal should be arranged in thermal contact with means for transferring heat away from the crystal.

A good vacuum should be maintained to prevent degradation of the cathode.

In order to realize (one or more of) the above requirements, preferably the following is done:

A. The cup 72 is chosen to be made of "lead glass", the same as is used for the (microneck) glass gun portion 73. This is to assure identical thermal expansion coefficients. The cup is frit-sealed to the glass gun with a ceramic glass frit material, e.g. Pyroceram Type 7590 material. The frit seal 74 is made by locally heating the Ceramic glass material to a temperature below its crystallization point. A "binder" is added to improve high-voltage insulation behaviour.

B. The cup is internally spraycoated with a conductive ITO-layer 75 (indium-tin oxide). Thus, the electrical connection to the glass gun is established, and back-scattered electrons are removed. Alternatively a coating with a conductive, carbon based material like (non-transparent) Aquadag material may be applied.

C. An optically flat output window 76 is constructed in steps:
  a. A circular window is sawed from sheet glass or flattened glass.
  b. The window is optically polished.
  c. The inner surface of the window is coated with ITO. The thickness of the coating is chosen to provide maximum transmission at the laser wavelength (e.g. $\lambda=670$ nm).
  d. A short lead glass side tube 77 is connected to the cup, opposite to the position of the laser crystal, in a direction perpendicular to the electron-optical axis 2.
  e. The side tube 77 is polished back to extend less than 1 mm from the cup wall.
  f. The window 76 is frit-sealed to the side tube 77 with a ceramic glass frit material like Polyceram 7590 material. As a binder, isopropanol is used, whereby the resulting frit seal has improved high-voltage insulating properties.

D. A laser crystal 78 is soldered on a Cu-pedestal 79, used an eutectic AuGe-solder preform. Prior to the soldering step, the copper pedestal is heated to 500°–600° C. to remove any oxide. Thus, good wetting of the solder is achieved. The distance from the laser crystal 78 to the window 76 is 7–9 mm in this exemplary embodiment.

E. The copper pedestal 79 is screwed to a copper rod 80 to ensure good thermal and electrical contact. Since it is not practical to make a vacuum tight connection from lead glass to copper, a transition zone is needed. The transition is made by using two FeCr tubelets 81a, 81b. The first one is connected to the lead glass cup 72 with a standard glass-metal joining. The second one is soldered with Rontgen-Ag-solder 82 to the copper rod 80. Finally, the two FeCr-tubelets 81a, 81b are joined together by laser welding. This offers a rotational degree of freedom in the assembly which is very important: the laser crystal 78 and the optical window 76 can be easily and accurately aligned prior to the laser welding. The wall thickness of the FeCr tubes 81a, 81b is chosen small to enable flexing to compensate for the differences in thermal expansion of copper and lead glass.

F.
  a. To maintain good vacuum a Ba-getter 83 is placed in the cup 72. The getter should be carefully positioned so as not to evaporate Ba into the glass gun or onto the optical window 76.
  b. To minimize degassing of the copper pedestal 79 resulting from electron bombardment, the laser crystal 78 and its surroundings may be partly covered by a thin (10 μm) Ta-mask. The mask has an opening in the form of the laser crystal, e.g. with a length of 5 mm and a width of 200–250 μm. The Ta-foil contains a limited amount of residual gases, while the copper parts, being relatively porous, have a much larger degassing volume. The electron beam now only impinges on the Ta-foil, or on the laser crystal, and it never hits the copper holder.

Apart from in the earlier-mentioned applications, the present laser scanner may be used advantageously in many areas including:

laser printing, photo typesetting, photo lithography;
marking, hole punching, annealing;
digital code reading, optical inspection, range finding, microscopy, optical character recognition, facsimile, ophthalmology, robotic vision, quality control; and
optical recording.

In order to get efficient, stable and reliable operation, the transversely elongated electron beam should preferably:

1. maintain a scanning movement centered over the laser crystal in spite of a tendency of the beam to drift slowly away from the optimum setting.
2. remain focused on the laser crystal during each scan; (The required focus voltage may change slowly over time because of stray magnetic fields, temperature effects or aging of the cathode or of the laser crystal); and
3. maintain an optimum elongated shape and length. (Again a slow drift is anticipated.)

For an illustration of various electron beam elongations, see FIG. 9. Laser crystal 78 is shown irradiated with a focused, transversely-elongated electron beam. Under optimum conditions, the elongated electron beam covers the laser crystal from side facet to facet. If the focus voltage is too high, the electrostatic lens is too weak, and the electron beam acquires a more circular shape A. For a low focus voltage, the lens is too strong, and an oversized elliptical shape B is generated. An optimum setting C is to be pursued to obtain the elliptical shape and length C.

What is proposed is the use of several feed-back loops to achieve stable and reliable operation. For the above-referred to scan centering (1) and focus voltage maintenance (2), the optical output of the laser is used to generate an error signal. To sense and maintain the optimum beam shape (3), an electron-beam-detecting slit may be mounted close to the laser crystal.

1. Centering alignment:

In FIG. 10 laser crystal 78 is shown with a scanning electron spot that is periodically slightly misaligned. This figure shows the situation that occurs when the misalignment changes very rapidly, e.g. in synchronism with a scan period of 0.010–0.020 ms. In this situation, the intensity of the generated laser light will modulate with the double frequency, as is illustrated in FIG. 10B. An optimum long term setting of the alignment is achieved by applying a low-frequency modulation or "wobble" on the deflection voltage applied to the electron gun. The intensity of the generated laser light will be as shown in FIG. 10C where fast scans and retraces are visible, a low frequency wobble being superimposed on the intensity. With a phase-sensitive amplifier at the double frequency this low-frequency modulation can be picked-up easily, and this can be used in a feedback loop to achieve an average optimum setting.

2. Focusing:

In FIG. 11 again laser crystal 78 is shown with a scanning electron spot. This time, the focus voltage is varied during the scan. The resulting spot shapes are drawn and the effect on the laser output is seen to modulate again at the double frequency (FIG. 11B). Applying a low-frequency modulation of the focus voltage will result in a low-frequency modulation of the intensity (again at the double frequency) as shown in FIG. 11G. As in the case of the alignment stated above, this can be picked up by a lock-in amplifier and it can be used to maintain an optimum focus setting.

Figure 12:
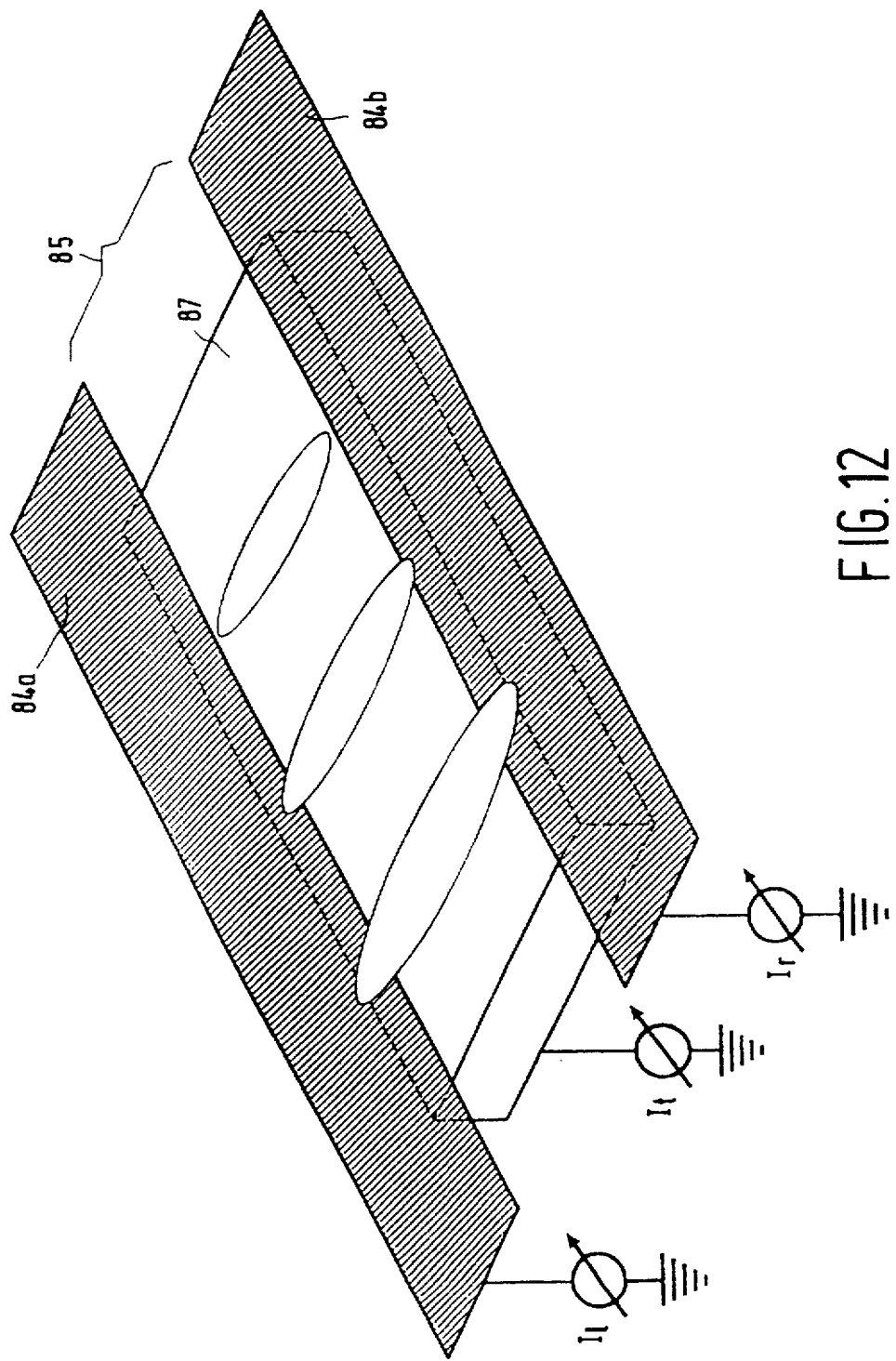
FIG. 12 is a sketch of an electron beam detection means.

3. Optimum beam elongation:

In order to maintain the optimum beam elongation, a more elaborate solution is used, such as is shown in FIG. 12. Laser crystal 78 is shown, partly covered with spaced apart electron beam detection means 84a, 84b defining a slit 85. The beam currents $I_l$ and $I_r$, intercepted by the left and the right part of this means are measured. Also, the electron beam current $I_t$ on the laser crystal target is measured. The sum of the intercepted currents relative to the total beam current gives a measure of the elongation of the electron beam and it can be used in a feedback loop to maintain the optimum beam elongation. As an extra benefit, the difference in the intercepted currents gives information on the alignment. From practical experience, it is not expected that the beam elongation will drift dramatically in time.

We claim:

1. An electron-optical device comprising a cathode-ray tube having a glass envelope comprising a target for electrons, which target comprises at least one laser crystal, an electron gun arranged opposite the target for producing an electron beam, said gun including an electrostatic focusing lens for focusing the electron beam on the target, and means for causing the electron beam to scan the target, the electrostatic focusing lens being formed in at least a portion of a multi-element layer electrode arranged on the inner surface of the tube, the envelope comprising a side window, the laser crystal being arranged on a metal support which is provided with positioning means to arrange the crystal in aligned and accurately spaced relationship with respect to the window and the electron gun during assembly.

2. A device as claimed in claim 1, characterized in that the positioning means enable rotation of the support around the longitudinal tube axis and/or movement along the longitudinal tube axis during assembly.

3. A device as claimed in claim 2, characterized in that the support is attached to a metal rod which is soldered to an end of a first metal tube, a second metal tube being connected to an end of the glass envelope, the first and second tube being welded together at their free ends.

4. An electro-optical device comprising a cathode-ray-tube having a glass envelope comprising a target for electrons, which target comprises at least one laser crystal, an electron gun arranged opposite the target for producing an electron beam, an electrostatic focusing lens for focusing the electron beam on the target and means for causing the electron beam to scan the target, the electrostatic focusing lens being formed in at least a portion of a multi-element layer electrode arranged on the inner surface of the tube, the device including means for obtaining a feedback voltage having the proper information for promoting optimum centring of the electron beam during the scanning operation.

5. An electro-optical device comprising a cathode-ray-tube having a glass envelope comprising a target for electrons, which target comprises at least one laser crystal, an electron gun arranged opposite the target for producing an electron beam, an electrostatic focusing lens for focusing the electron beam on the target and means for causing the electron beam to scan the target, the electrostatic focusing lens being formed in at least a portion of a multi-element layer electrode arranged on the inner surface of the tube, the device including means for obtaining a feedback voltage having the proper information for promoting an optimum focus setting.

6. An electro-optical device comprising a cathode-ray-tube having a glass envelope comprising a target for electrons, which target comprises at least one laser crystal, an electron gun arranged opposite the target for producing an electron beam, an electrostatic focusing lens for focusing the electron beam on the target and means for causing the electron beam to scan the target, the electrostatic focusing lens being formed in at least a portion of a multi-element layer electrode arranged on the inner surface of the tube, the device including means for obtaining a feedback voltage having the proper information for promoting optimum transverse beam elongation.

* * * * *